US011796622B2

(12) United States Patent
Teboulle et al.

(10) Patent No.: US 11,796,622 B2
(45) Date of Patent: Oct. 24, 2023

(54) CALIBRATION OF ROGOWSKI SENSOR

(71) Applicant: SAGEMCOM ENERGY & TELECOM SAS, Rueil Malmaison (FR)

(72) Inventors: Henri Teboulle, Rueil Malmaison (FR); Marc Jeanrot, Rueil Malmaison (FR); Julien Sotiere, Rueil Malmaison (FR)

(73) Assignee: SAGEMCOM ENERGY & TELECOM SAS, Rueil Malmaison (FR)

( * ) Notice: Subject to any disclaimer, the term of this patent is extended or adjusted under 35 U.S.C. 154(b) by 0 days.

(21) Appl. No.: 17/833,958

(22) Filed: Jun. 7, 2022

(65) Prior Publication Data

US 2023/0012335 A1 Jan. 12, 2023

(30) Foreign Application Priority Data

Jun. 7, 2021 (FR) .................................... 2105993

(51) Int. Cl.
   *G01R 35/00* (2006.01)
   *G01R 15/18* (2006.01)
   *G01R 22/06* (2006.01)

(52) U.S. Cl.
   CPC ......... *G01R 35/005* (2013.01); *G01R 15/181* (2013.01); *G01R 22/061* (2013.01); *G01R 22/068* (2013.01)

(58) Field of Classification Search
   CPC .. G01R 35/005; G01R 15/181; G01R 22/061; G01R 22/068
   USPC .......................................... 324/74, 126, 127
   See application file for complete search history.

(56) References Cited

U.S. PATENT DOCUMENTS

| | | | |
|---|---|---|---|
| 2008/0211484 A1* | 9/2008 | Howell ................ | G01R 15/181 336/229 |
| 2013/0191053 A1* | 7/2013 | Spanier ................. | G01R 22/10 702/60 |
| 2014/0340072 A1* | 11/2014 | Chamarti ................ | G01R 1/20 29/605 |
| 2020/0033435 A1* | 1/2020 | Macias ............... | G01R 15/148 |

OTHER PUBLICATIONS

B. V. Djokic, "Improvements in the Performance of a Calibration System for Rogowski Coils at High Pulsed Currents," in IEEE Transactions on Instrumentation and Measurement, vol. 66, No. 6, pp. 1636-1641, Jun. 2017, doi: 10.1109/TIM.2016.2624578. (Year: 2017).*

* cited by examiner

*Primary Examiner* — Tung X Nguyen
*Assistant Examiner* — Robert P Alejnikov, Jr.
(74) *Attorney, Agent, or Firm* — Muncy, Geissler, Olds & Lowe, P.C.

(57) ABSTRACT

A method for the onsite calibration of a Rogowski sensor to be calibrated, includes the steps of: cause the sensor to be calibrated to be positioned on a reference phase, or cause a reference sensor to be positioned on the phase to be calibrated; acquiring a calibration current measurement produced by the sensor to be calibrated, a reference current measurement produced by the reference sensor, and a reference voltage measurement on the phase on which are positioned the reference sensor to be calibrated following the positioning step; and using the calibration current measurement, the reference current measurement and the reference voltage measurement to produce calibration parameters of the sensor to be calibrated.

10 Claims, 5 Drawing Sheets

CALIBRATION OF ROGOWSKI SENSOR

The invention relates to the field of multiphase electricity meters connected to Rogowski sensors.

BACKGROUND OF THE INVENTION

Certain electricity meters, and in particular meters used in industrial applications, measure electrical powers and energies which are distributed via very high current levels (up to 2000 A typically). These meters are generally three-phase meters.

The current sensors used are thus conventionally Rogowski sensors. In these sensors, the coil support is non-ferromagnetic and provides a very good linearity, as there is no magnetic saturation. These sensors are therefore very good candidates for high-voltage and high-current applications.

Rogowski sensors are generally installed at a certain distance from the meter (sometimes more than ten metres). Each sensor is thus positioned on a phase of the distribution network (i.e. that the Rogowski loop surrounds the conductor forming the phase), and is connected to the meter by a cord.

The calibration of the sensors can be done in the factory, before the meter is delivered to the customer. Each sensor is thus matched with a separate phase of the meter, and the calibration parameters are memorised in the meter.

This calibration in the factory makes it possible to use non-precalibrated Rogowski sensors (no guaranteed tolerance) and not requiring a specific precision. The same performances are thus obtained as with more "intrinsically" efficient Rogowski sensors.

However, when a Rogowski sensor must be replaced onsite, for example following a fault, measuring precisions equivalent to those of other sensors connected to the meter must be obtained with the new sensor. Yet, the test bench used in the factory is not available to perform a new calibration.

It has therefore been considered to use precalibrated Rogowski sensors.

Certain Rogowski sensors of the prior art thus comprise a processing circuit memorising the calibration parameters measured in the factory. The processing circuit comprises, for example, a microcontroller and a memory located in a case, itself integrated in the cord. Thus, when the sensor is positioned on a phase and connected to the meter, onsite, the meter reads in the case, the calibration parameters of the sensor and uses them to measure the current circulating over the phase.

However, such sensors are very expensive relative to non-precalibrated Rogowski sensors. Moreover, this solution is less flexible, as it requires to use a quite particular type of sensor.

OBJECT OF THE INVENTION

The invention aims to calibrate onsite, simply and inexpensively, a new Rogoswki sensor intended to be connected to a multiphase electricity meter.

SUMMARY OF THE INVENTION

In view of achieving this aim, a method is proposed, for the onsite calibration of a Rogowski sensor to be calibrated which is intended, in operation, to be connected to a multiphase electricity meter by being positioned on a phase to be calibrated, the method comprising the first steps or:

causing the Rogowski sensor to be calibrated to be positioned on a first reference phase, on which a first, already-calibrated reference Rogowski sensor is positioned, or positioning the first reference Rogowski sensor on the phase to be calibrated;

acquiring a first calibration current measurement produced by the Rogowski sensor to be calibrated, a first reference current measurement produced by the first reference Rogowski sensor, and a first reference voltage measurement on a first positioning phase on which are positioned the Rogowski sensor to be calibrated and the first reference Rogowski sensor following the positioning step;

using the first calibration current measurement, the first reference current measurement and the first reference voltage measurement to produce first calibration parameters of the Rogowski sensor to be calibrated.

The calibration method according to the invention therefore makes it possible to calibrate, onsite, a new Rogowski sensor, simply, quickly, inexpensively, and not requiring any particular equipment.

The calibration parameters are defined onsite, and it is therefore not necessary that the newly installed Rogowski sensor integrates beforehand, its own calibration parameters. It is therefore possible to install onsite and to connect to the meter, any commercial and non-precalibrated Rogowski sensor.

The calibration method according to the invention therefore makes it possible to reduce the cost of the Rogowski sensors used and provides a significant flexibility as regards the choice of said sensors.

In addition, a calibration method such as described above is proposed, further comprising the steps of calculating a first active calibration power and a first reactive calibration power from the first calibration current measurement and from the first reference voltage measurement, as well as a first reference active power and a first reference reactive power from the first reference current measurement and from the first reference voltage measurement, and of calculating the first calibration parameters from the first active calibration power, from the first reactive calibration power, from the first reference active power and from the first reference reactive power.

In addition, a calibration method such as described above is proposed, in addition comprising second steps similar to the first steps, but implemented with, instead of the first reference phase and of the first reference Rogowski sensor, a second reference phase and a second already-calibrated reference Rogowski sensor, the first steps and the second steps making it possible to produce consolidated calibration parameters of the Rogowski sensor to be calibrated.

In addition, a calibration method such as described above is proposed, the second steps making it possible to produce second calibration parameters, the method further comprising the step of calculating an arithmetic average of the first calibration parameters and of the second calibration parameters to produce the consolidated calibration parameters.

In addition, a calibration method such as described above is proposed, wherein the second steps comprise the step of calculating a second reference active power and a second reference reactive power, the method further comprising the steps of calculating an arithmetic average of the first reference active power and of the second reference active power to obtain an averaged reference active power, and of calculating an arithmetic average of the first reference reactive power and of the second reference reactive power to obtain an averaged reference reactive power, the consolidated calibration parameters being obtained from the first active calibration power, of the first reactive calibration power, of the averaged reference active power and of the averaged reference reactive power.

In addition, a calibration method such as described above is proposed, wherein the first steps comprise the step of positioning the first reference Rogowski sensor on the phase to be calibrated, wherein the second steps comprise the step of positioning the second reference Rogowski sensor on the phase to be calibrated, and wherein the step of acquiring first steps and the step of acquiring second steps are simultaneously carried out.

In addition, a calibration method such as described above is proposed, wherein the calibration parameters comprise a gain and a dephasing of a current measuring chain comprising the Rogowski sensor to be calibrated and an internal processing circuit integrated in the meter and comprising an integrator.

In addition, a multiphase electricity meter is proposed, comprising a processing unit arranged to implement the calibration method such as described above.

In addition, a multiphase electricity meter such as described above is proposed, further comprising a man-machine interface, the processing unit being arranged to communicate with an operator via the man-machine interface to cause it to position the Rogowski sensor to be calibrated and/or the first reference Rogowski sensor and/or the second reference Rogowski sensor, so as to implement the calibration method, and to, when the calibration method has been performed, repositioning the Rogowski sensor to be calibrated and/or the first reference Rogowski sensor and/or the second reference Rogowski sensor in their nominal position, so as to return the meter and the Rogowski sensors into a nominal configuration.

In addition, a computer program is proposed, comprising instructions which drive the processing unit of the multiphase electricity meter such as described above to execute the steps of the calibration method such as described above.

In addition, a recording media which can be read by a computer is proposed, on which the computer program is recorded, such as described above.

The invention can be better understood in the light of the following description of particular, non-limiting embodiments of the invention.

BRIEF DESCRIPTION OF THE DRAWINGS

Reference will be made to the appended drawings, from among which.

DETAILED DESCRIPTION OF THE INVENTION

Figure 1:
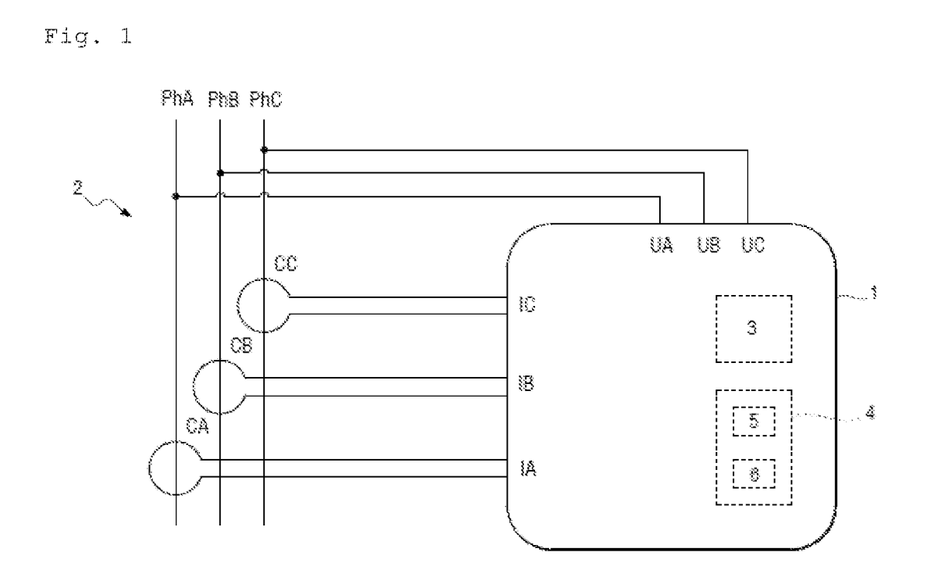
FIG. 1 represents a three-phase electricity meter and three Rogowski sensors each positioned on a separate phase, in their nominal operational position.

In reference to FIG. 1, the calibration method according to a first embodiment of the invention is here implemented in a three-phase electricity meter 1. The meter is used to measure the electrical energy supplied to an installation by a distribution network 2 comprising three phases: PhA, PhB and PhC.

The meter 1 uses Rogowski sensors CA, CB, CC to measure the currents circulating over the phases. The Rogowski sensors are located outside of the meter 1. Each Rogowski sensor is connected to the meter 1 by a cord, possibly several metres long. When the meter 1 is operational and when the Rogowski sensors are installed in their nominal position (configuration of FIG. 1), the sensor CA is positioned on the phase PhA by being connected to a current input IA of the meter 1, the sensor CB is positioned on the phase PhB by being connected to a current input IB of the meter 1, and the sensor CC is positioned on the phase PhC by being connected to a current input IC of the meter 1. FIG. 1 therefore represents the interfacing architecture of the meter 1 upon starting and in a permanent steady state.

For each Rogowski sensor, the meter 1 comprises an internal processing circuit comprising an integrator; each Rogowski sensor and the associated internal processing circuit form a "current measuring chain". Of course, certain components of the internal processing circuits can be common to the three current measuring chains.

The meter 1 also comprises a voltage input UA connected to the phase PhA, a voltage input CB connected to the phase PhB, and a voltage input UC connected to the phase PhC. The meter 1 comprises voltage sensors connected to the voltage inputs and making it possible to measure the voltage present on each phase.

The meter 1 also comprises a man-machine interface 3 (MMI) making it possible for an operator to communicate with the meter 1. The MMI 3 here comprises a screen located on the front face of the meter 1, as well as buttons themselves also located on the front face of the meter 1 and making it possible for the operator to navigate in menus displayed on the screen, and to return instructions to control certain functions implemented by the meter 1.

The meter 1 also comprises a processing unit 4 comprising at least one processing component 5 adapted to execute instructions of a program to implement the calibration method according to the invention. The program is stored in a memory 6 of the processing unit 4, which is integrated in or connected to the processing component 5. The processing component 5 is, for example, a conventional processor, a microcontroller, a DSP (Digital Signal Processor), or a programmable logic circuit, such as an FPGA (Field Programmable Gate Array) or an ASIC (Application Specific Integrated Circuit).

Figure 2:
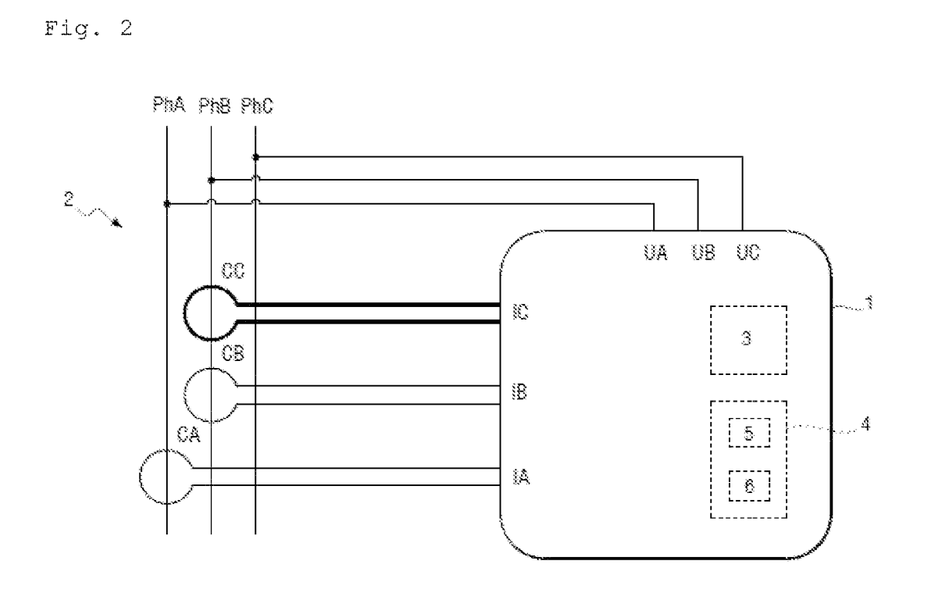
FIG. 2 is a figure similar to FIG. 1, the sensor to be calibrated being positioned on a first reference phase.

In reference to FIG. 2, first the calibration method according to a first embodiment of the invention is described.

FIG. 2 corresponds to a situation wherein a new sensor CC must be installed, for example, because the preceding sensor CC is faulty. The meter 1 does not know the new sensor CC, which must therefore be calibrated. The calibration is therefore done onsite (and not in the factory or in the workshop), i.e. after the meter 1 has been delivered and installed at the customer's site. The other sensors CA and CB are operational and have already been calibrated in the factory (just like the preceding sensor CC). The calibration method uses reference measurements taken by one or both sensors CA and CB to calibrate the new sensor CC.

The operator first uses a menu displayed on the screen of the meter 1 to put the meter 1 into a calibration mode.

The operator thus specifies that the sensor to be calibrated is the sensor CC. The operator then informs a first phase reference, which is here, for example, the phase PhB. The sensor CB, already calibrated, is located on the first reference phase and plays the role of a first reference sensor.

The processing unit 4 thus communicates with the operator via the screen, and asks to position the sensor CC on the phase PhB.

Following this positioning step, two sensors are positioned on the phase PhB: the sensor CB and the sensor CC.

The processing unit 4 of the meter 1 thus knows that the sensor to be calibrated is that connected to the current input IC (sensor CC) and that the first reference sensor is that connected to the current input IB (sensor CB).

The processing unit 4 thus acquires a first calibration current measurement produced by the sensor CC, a first reference current measurement produced by the sensor CB, and a first reference voltage measurement. The first reference voltage measurement is a voltage measurement on a first positioning phase on which are positioned the sensor CC and the sensor CB following the positioning step. The first positioning phase is therefore the phase PhB. The first reference voltage measurement is produced by the voltage sensor connected to the voltage input UB.

The processing unit 4 thus uses the first calibration current measurement, the first reference current measurement and the first reference voltage measurement to produce first calibration parameters of the Rogowski sensor to be calibrated (the sensor CC).

More specifically, the processing unit 4 calculates a first active calibration power $P_m$ and a first reactive calibration power $Q_m$ from the first calibration current measurement and from the first reference voltage measurement, as well as a first reference active power $P_{ref}$ and a first reference reactive power $Q_{ref}$ from the first reference current measurement and from the first reference voltage measurement, and calculates the first calibration parameters from the first active calibration power, from the first reactive calibration power, from the first reference active power, and from the first reference reactive power.

The first calibration parameters of the sensor CC comprise a gain $K_1$ and a dephasing $\Delta\varphi_1$ of all of the current measuring chain of the sensor CC, including the gin and the dephasing of the sensor CC and of the internal integrator in the meter 1.

To determine the calibration parameters $K_1$ and $\Delta\varphi_1$, the processing unit 4 resolves the following system of two equations with two unknowns ($K_1$ and $\Delta\varphi_1$):

$$P_{ref} = K_1 \cdot \cos(\Delta\varphi_1) \cdot Pm + K_1 \cdot \sin(\Delta\varphi_1) \cdot Qm$$

$$Q_{ref} = -K_1 \cdot \sin(\Delta\varphi_1) \cdot Pm + K_1 \cdot \cos(\Delta\varphi_1) \cdot Qm$$

A typical value of $K_1$ is, for example, 5/10000 (current of 2000 A returned to 1V, for example). A typical value of $\Delta\varphi_1$ is, for example, 0.05°.

It is noted that by "measurement" (of current, of voltage), this does not necessarily mean one single measurement, but rather several measurements taken over a certain duration (one minute, for example) and processed (averaged or filtered, for example) to obtain a consolidated measurement.

The first calibration parameters are thus recorded and used by the processing unit 4 to calibrate the sensor CC.

The processing unit 4 thus asks the operator, via the MMI 3, to correctly reposition the sensors in their nominal position, so as to return the meter 1 and the sensors in a nominal configuration. Here, in this case, the processing unit 4 cause the sensor CC to be repositioned on the phase PhC (the sensors CA and CB not having been moved).

Figure 3:
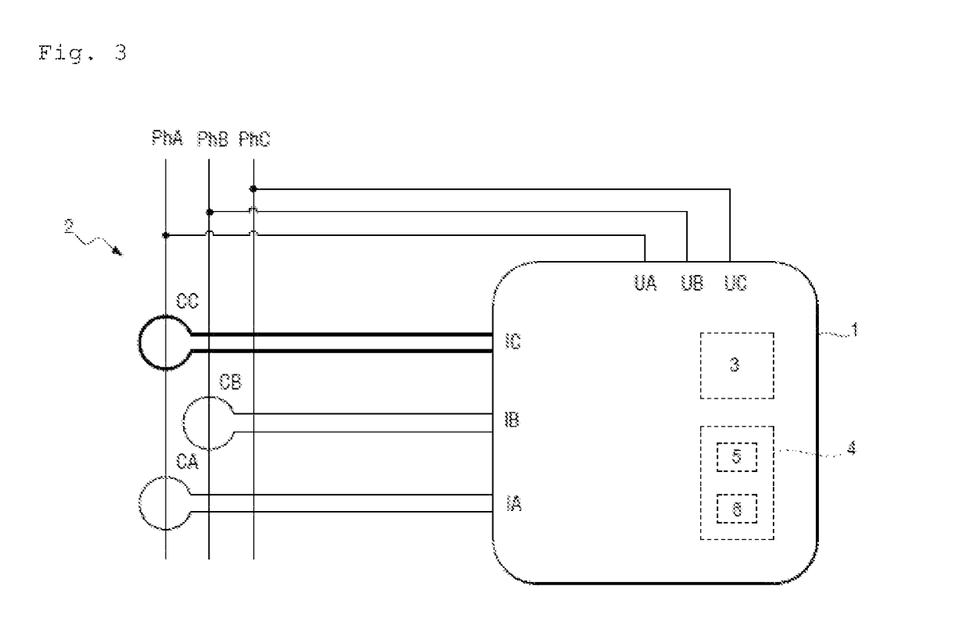
FIG. 3 is a figure similar to FIG. 1, the sensor to be calibrated being positioned on a second reference phase.

In reference to FIG. 3, it is possible to repeat the first calibration steps, which have just been described. Thus, two calibration steps similar to the first calibration steps are carried out, but implemented with, instead of the first reference phase (PhB) and of the first reference Rogowski sensor (CB), a second reference phase (PhA) and a second reference Rogowski sensor (CA), already calibrated and intended, in operation, to be connected to the meter 1 by being positioned on the second reference phase (PhA). The first steps and the second steps make it possible to produce consolidated calibration parameters (more precise) of the Rogowski sensor to be calibrated CC.

Thus, not one but two calibrations are performed, by first positioning the sensor CC on the phase PhB (FIG. 2), then by positioning the sensor CC on the phase PhA (FIG. 3). The first calibration steps make it possible to obtain first calibration parameters, $K_1$ and $\Delta\varphi_1$, while the second calibration steps make it possible to obtain second calibration parameters $K_2$ and $\Delta\varphi_2$.

The second calibration parameters are obtained by calculating a second active calibration power and a second reactive calibration power, as well as a second reference active power and a second reference reactive power. The second active calibration power and the second reactive calibration power are calculated from the second calibration current measurement (produced by the sensor CC) and from the second reference voltage measurement (on the phase PhA). The second reference active power and the second reference reactive power are calculated from the second reference current measurement (produced by the sensor CA) and from the second reference voltage measurement (on the phase PhA).

The processing unit 4 thus produces consolidated calibration parameters.

The processing unit 4 calculates, for example, an arithmetic average of the first calibration parameters and of the second calibration parameters (i.e. on the one hand, an average of $K_1$ and of $K_2$ and, on the other hand, an average of $\Delta\varphi_1$ and of $\Delta\varphi_2$) to produce the consolidated calibration parameters.

Figure 4:
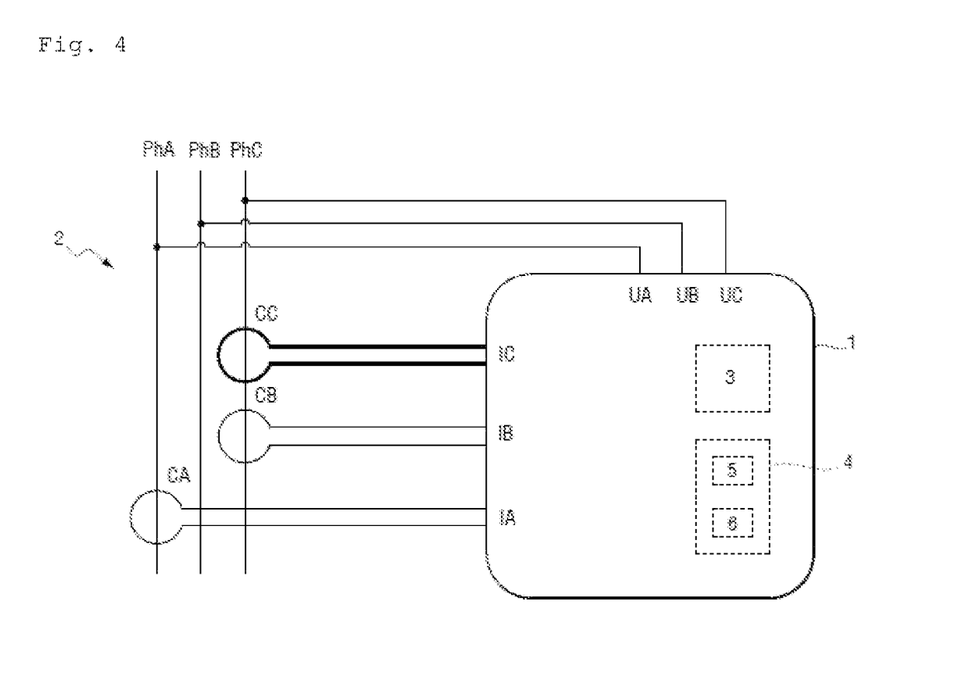
FIG. 4 is a figure similar to FIG. 1, a first reference sensor being positioned on the phase to be calibrated.

The calibration method according to a second embodiment of the invention is now described, in reference to FIG. 4.

The sensor to be calibrated is again the sensor CC. The operator this first designates, not a first reference phase, but a first reference sensor, here the sensor CB.

The processing unit 4 thus asks the operator to position the sensor CB on the phase to be calibrated, which is here the phase PhC. The phase to be calibrated is the phase on which the sensor to be calibrated is intended to be positioned in operation.

Two sensors are thus positioned on the phase PhC: the sensor to be calibrated CC and the first reference sensor CB.

The processing unit 4 of the meter 1 knows that the Rogowski sensor to be calibrated is that connected to the current input (IC) (sensor CC) and that the first reference sensor is that connected to the current input IB (sensor CB).

The processing unit 4 thus acquires a calibration current measurement produced by the sensor CC, a first reference current measurement produced by the sensor CB, and a first reference voltage measurement on the phase PhC (on which are positioned the sensor to be calibrated CC and the first reference sensor following the positioning step).

The first reference voltage measurement is produced by the voltage sensor connected to the voltage input CC.

The processing unit 4 thus uses the first calibration current measurement, the first reference current measurement and the first reference voltage measurement to produce first calibration parameters of the sensor CC.

More specifically, the processing unit 4 calculates a first active calibration power $P_m$ and a first reactive calibration power $Q_m$ from the first calibration current measurement and from the first reference voltage measurement, as well as a first reference active power $P_{ref}$ and a first reference reactive power $Q_{ref}$ from the first reference current measurement and from the first reference voltage measurement. The processing unit 4 calculates the first calibration parameters from the first active calibration power, from the first reactive calibration power, from the first reference active power and from the first reference reactive power.

The first calibration parameters comprise a gain $K_1$ and a dephasing $\Delta\varphi_1$ of the current measuring chain of the sensor CC.

To determine the calibration parameters $K_1$ and $\Delta\varphi_1$, the processing unit 4 resolves the system according to two equations with two unknowns ($K_1$ and $\Delta\varphi_1$):

$$P_{ref}=K_1 \cdot \cos(\Delta\varphi_1) \cdot Pm + K_1 \cdot \sin(\Delta\varphi_1) \cdot Qm$$

$$Q_{ref}=-K_1 \cdot \sin(\Delta\varphi_1) \cdot Pm + K_1 \cdot \cos(\Delta\varphi_1) \cdot Qm$$

The processing unit 4 thus asks the operator, via the MMI 3, to correctly reposition the sensors in their nominal position, so as to make the meter 1 operational. Here, in this case, the processing unit 4 repositions the sensor CB on the phase PhB (the sensors CA and CC not having been moved).

Figure 5:
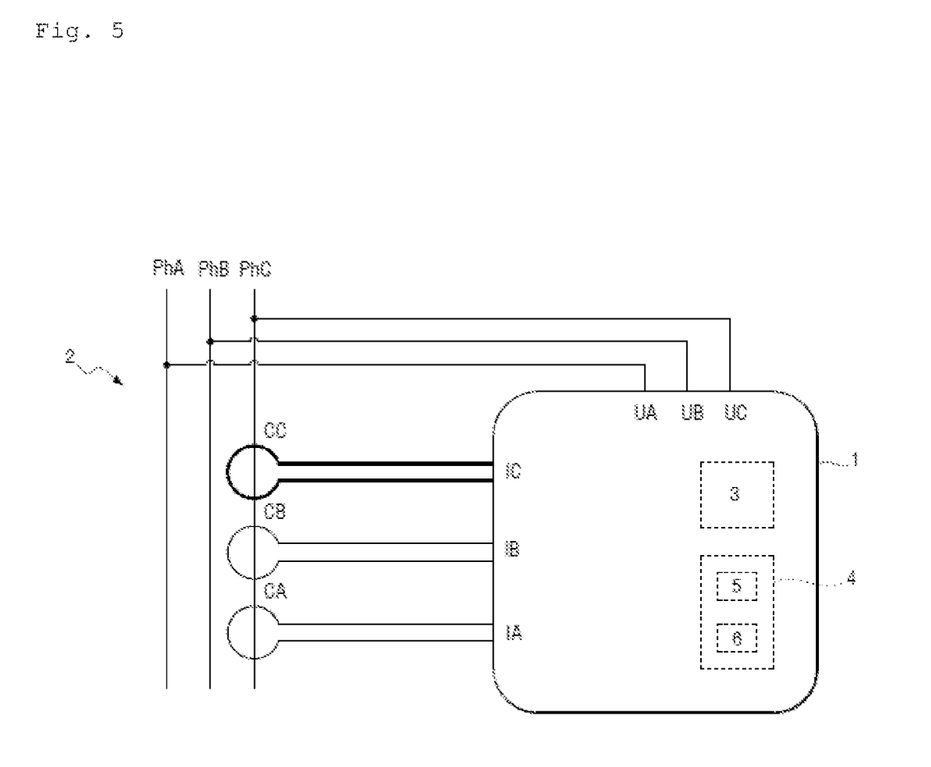
FIG. 5 is a figure similar to FIG. 1, the first reference sensor and a second reference sensor being positioned on the phase to be calibrated.

In reference to FIG. 5, it is possible to repeat the first calibration steps which have just been described. Second calibration steps similar to the first calibration steps are thus carried out, but implemented with, instead of the first reference Rogowski sensor (CB), a second reference Rogowski sensor (CA).

Thus, not one but two simultaneous calibrations are carried out by first positioning the sensor CB on the phase to be calibrated CC, then by positioning the sensor CA on the phase to be calibrated CC.

The first calibration steps and the second calibration steps, carried out simultaneously, make it possible to produce consolidated calibration parameters of the Rogowski sensor to be calibrated CC.

The first calibration steps make it possible to calculate a first active calibration power $P_m$ and a first reactive calibration power $Q_m$, as well as a first reference active power $P_{ref1}$ and a first reference reactive power $Q_{ref1}$. The second calibration steps make it possible to simultaneously calculate a second reference active power $P_{ref2}$ and a second reference reactive power $Q_{ref2}$.

The processing unit 4 thus calculates an arithmetic average of the first reference active power $P_{ref1}$ and of the second reference active power $P_{ref2}$ to obtain an averaged reference active power $P_{ref}$, and calculates an arithmetic average of the first reference reactive power $Q_{ref1}$ and of the second reference reactive power $Q_{ref2}$ to obtain an averaged reference reactive power $Q_{ref}$.

The consolidated calibration parameters are obtained from the first active calibration power $P_m$, from the first reactive calibration power $Q_m$, from the averaged reference active power $P_{ref}$ and from the averaged reference reactive power $Q_{ref}$.

The processing unit 4 thus resolves a system of two equations with two unknowns ($K_1$ and $\Delta\varphi_1$).

$$P_{ref}=K_1 \cdot \cos(\Delta\varphi_1) \cdot Pm + K_1 \cdot \sin(\Delta\varphi_1) \cdot Qm$$

$$Q_{ref}=-K_1 \cdot \sin(\Delta\varphi_1) \cdot Pm + K_1 \cdot \cos(\Delta\varphi_1) \cdot Qm$$

with $$P_{ref} = \frac{(P_{ref1} + P_{ref2})}{2} \text{ and } Q_{ref} = \frac{(Q_{ref1} + Q_{ref2})}{2}.$$

Figure 6:
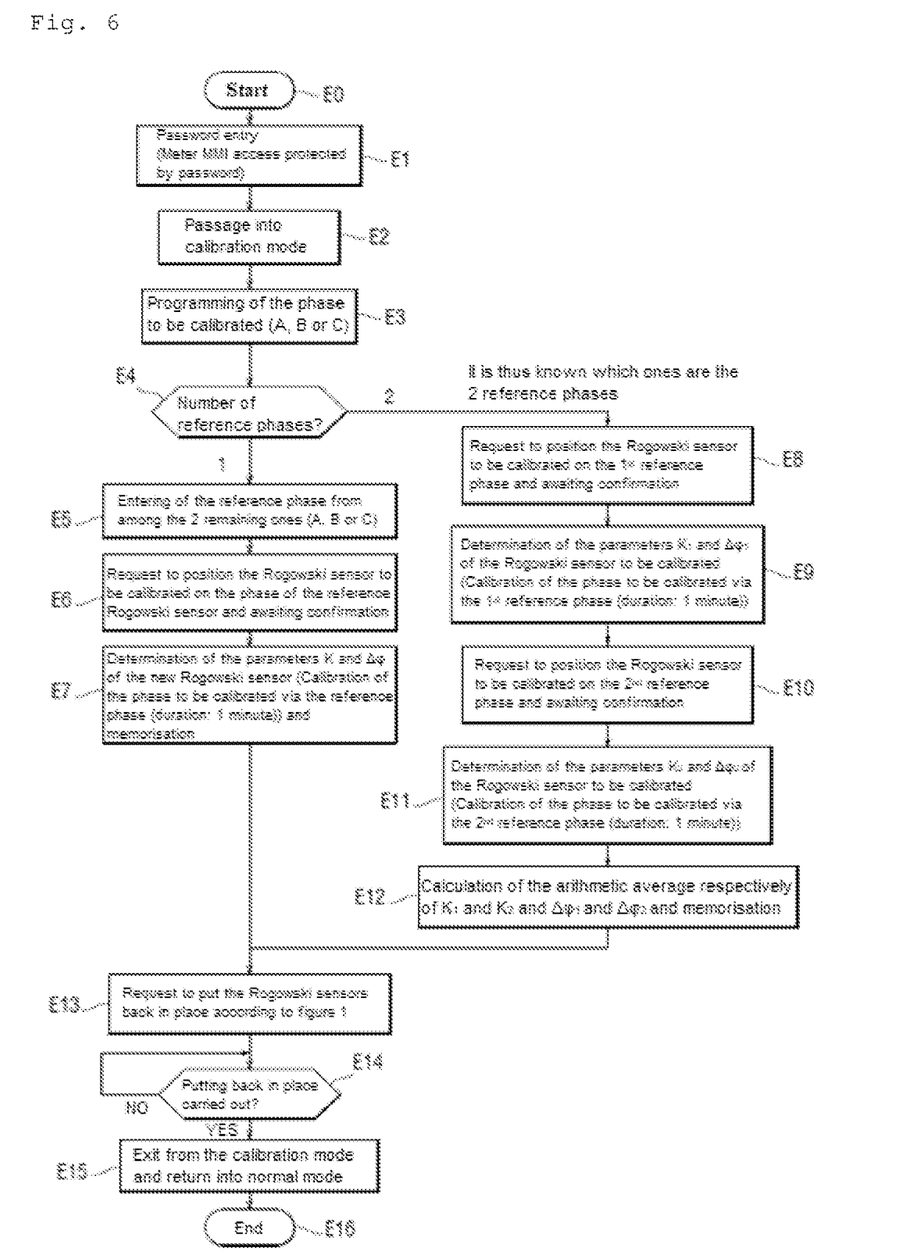
FIG. 6 represents steps of the calibration method according to a first embodiment of the invent ion.

A flowchart of the calibration method according to the first embodiment of the invention is now described, in reference to FIG. 6. It is therefore the Rogowski sensor to be calibrated (sensor CC) which is positioned on the reference phase which has been chosen or, if two reference phases are chosen, which is positioned successively on each of the reference phases.

The method starts at step E0.

To start the calibration method, the operator must beforehand enter a password protecting access to the MMI 3 of the meter 1 (step E1), then ask to actually enter into calibration mode (step E2).

The operator thus programs the phase to be calibrated—which is the phase PhC (step E3).

Then, the processing unit 4 asks the operator, via the MMI 3, to enter the number of reference phases (step E4).

Following step E4, in the case where there is only one reference phase, the processing unit 4 asks the operator, via the MMI 3, to enter the reference phase (step E5), then to position the Rogowski sensor to be calibrated (sensor CC) on the reference phase (here, for example, on the phase PhB): step E6.

The processing unit 4 thus awaits confirmation from the operator that the positioning has actually been carried out. This confirmation is made by the operator via the MMI 3. The meter 1 goes into actual calibration mode.

The processing unit 4 acquires the calibration current measurement (sensor CC), the reference current measurement (sensor CB) and the reference voltage measurement (phase CB), and determines the calibration parameters K and $\Delta\varphi$ (step E7). The measurements are taken over a duration of one minute, for example.

The calibration parameters K and $\Delta\varphi$ are thus memorised in the meter 1 as calibration parameters of the new Rogowski sensor, i.e. of the sensor CC.

Following step E4, in the case where there are two reference phases (phase PhB and phase PhA), the processing unit 4 first asks the operator, via the MMI 3, to position the sensor CC on the phase PhB (first reference phase): step E8.

The processing unit 4 awaits the confirmation that this positioning has actually been carried out.

The processing unit 4 acquires the first calibration current measurement (sensor CC), the first reference current measurement (sensor CB) and the first reference voltage measurement (phase CB), and determines the first calibration parameters $K_1$ and $\Delta\varphi_1$ (step E9). The measurements are taken over a duration of one minute, for example.

Then, the processing unit 4 asks the operator, via the MMI 3, to position the sensor CC on the phase PhA (second reference phase): step E10.

The processing unit 4 awaits the confirmation that this positioning has actually been carried out.

The processing unit 4 acquires the second calibration current measurement (sensor CC), the second reference current measurement (sensor CA) and the second reference voltage measurement (phase CA), and determines the second calibration parameters $K_2$ and $\Delta\varphi_2$ (step E11). The measurements are taken over a duration of one minute, for example.

Finally, the processing unit 4 calculates the arithmetic average, on the one hand, of $K_1$ and of $K_2$, and on the other hand, of $\Delta\varphi_1$ and of $\Delta\varphi_2$, and thus produces the consolidated calibration parameters. The consolidated calibration parameters are memorised and used as calibration parameters of the new Rogowski sensor (sensor CC): step E12.

Following step E7 or step E12, the processing unit asks the operator, via the MMI 3, to put back the Rogowski sensors in place according to the configuration of FIG. 1 (step E13).

When the processing unit 4 receives the confirmation that this positioning has actually been carried out (step E14), the meter 1 exits from the calibration mode and returns into the normal mode (step E15). The calibration method is completed (step E16).

Figure 7:
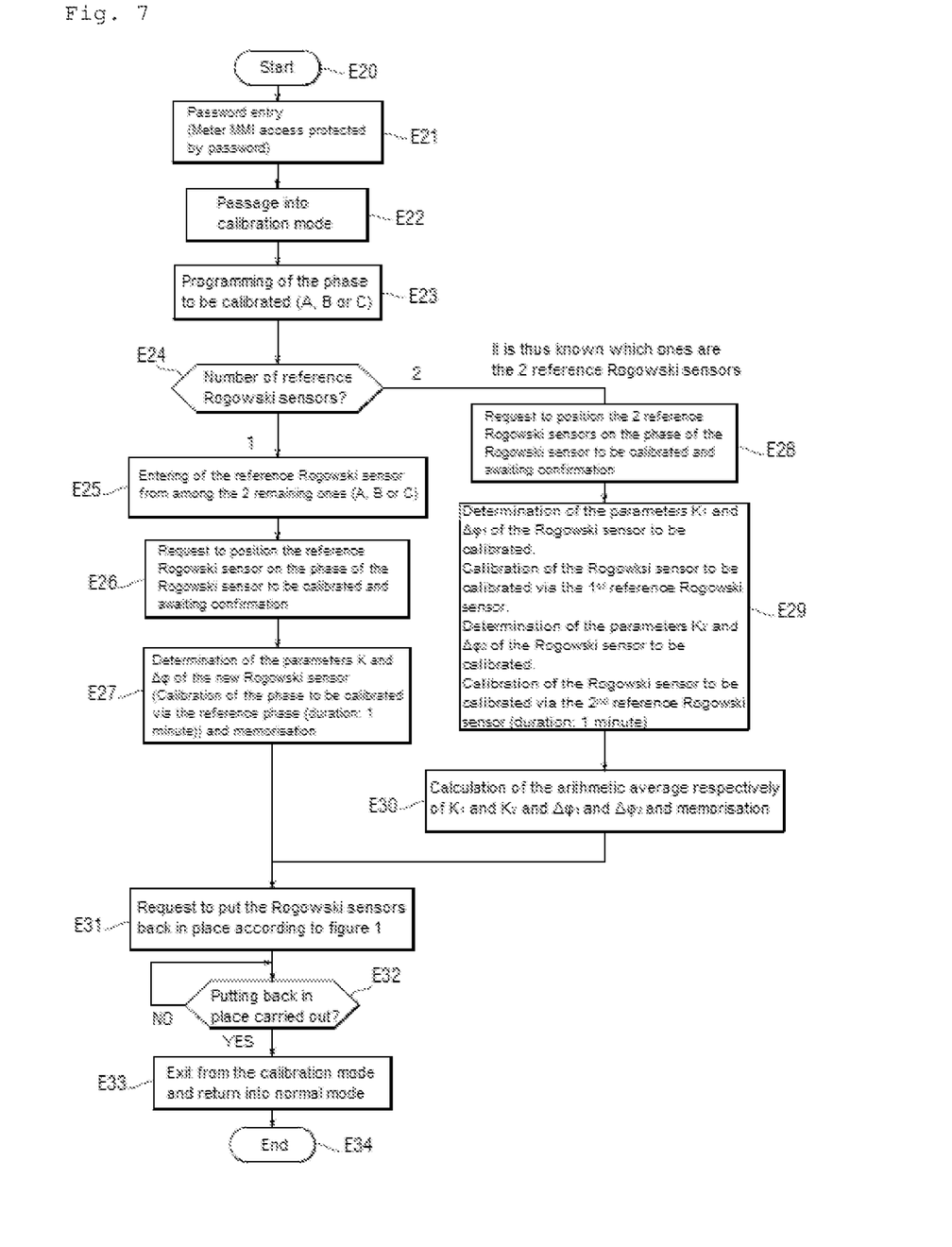
FIG. 7 represents steps of the calibration method according to a second embodiment of the invention.

A flowchart of the calibration method according to the second embodiment of the invention is now described, in reference to FIG. 7.

This time, it is the first reference sensor (here, the sensor CB) which is brought onto the phase to be calibrated PhC of the Rogowski sensor to be calibrated (sensor CC), or these are the reference sensors (sensor CB and sensor CA) which are brought onto the phase CC.

The method starts at step E20.

To start the calibration method, the operator must beforehand enter a password protecting access of the MMI 3 from the meter 1 (step E21), then ask to actually enter into calibration mode (step E22).

The operator thus programs the phase to be calibrated—which is the phase PhC (step E23).

Then, the processing unit 4 asks the operator, via the MMI 3, to enter the number of reference sensors (step E24).

Following step E24, in the case where there is only one reference sensor, the processing unit 4 asks the operator, via the screen of the MMI 3, to indicate the reference sensor (step E25), then to position the reference sensor (sensor CB) on the phase to be calibrated (phase PhC): step E26.

The processing unit 4 thus awaits confirmation from the operator that the positioning has actually been carried out. This confirmation is made by the operator via the MMI 3.

The processing unit 4 acquires the calibration current measurement (sensor CC), the reference current measurement (sensor CB) and the reference voltage measurement (phase CC), and determines the calibration parameters K and $\Delta\varphi$ (step E27). The measurements are taken over a duration of one minute, for example.

The calibration parameters K and $\Delta\varphi$ are thus memorised in the meter 1 as calibration parameters of the new Rogowski sensor, i.e. of the sensor CC.

Following step E24, in the case where there are two reference sensors (sensor CB and sensor CA), the processing unit 4 asks the operator, via MMI 3, to position the first reference sensor CB on the phase PhC and the second reference sensor CA on the phase PhC (step E28).

The processing unit 4 awaits the confirmation that this positioning has actually been carried out.

The processing unit 4 acquires the first calibration current measurement (sensor CC), the first reference current measurement (sensor CB) and the first reference voltage measurement (phase CC), and determines the first calibration parameters $K_1$ and $\Delta\varphi_1$.

The processing unit 4 simultaneously acquires the second reference current measurement (sensor CA) and determines the second calibration parameters $K_2$ and $\Delta\varphi_2$ (step E29). The processing unit 4 therefore uses, to determine the second calibration parameters $K_2$ and $\Delta\varphi_2$, the first calibration current measurement and the first reference voltage measurement.

The measurements of step E29 are here taken simultaneously over a duration of one minute, for example.

Finally, the processing unit 4 calculates the arithmetic average, on the one hand, of $K_1$ and of $K_2$, and, on the other hand, of $\Delta\varphi_1$ and of $\Delta\varphi_2$, and thus produces the consolidated calibration parameters. The consolidated calibration parameters are memorised and used as calibration parameters of the new Rogowski sensor (sensor CC): step E30.

Following step E27 or step E30, the processing unit 4 asks the operator, via the MMI 3, to put back the Rogowski sensors in place according to the configuration of FIG. 1: step E31.

When the processing unit 4 receives the confirmation that this positioning has actually been carried out (step E32), the meter exits from the calibration mode and returns into the normal mode (step E33). The calibration method is completed (step E34).

It is noted that during step E30, the consolidated calibration parameters could be obtained, not from $K_1$, $K_2$, $\Delta\varphi_1$ and $\Delta\varphi_2$, but from the averaged reference active power (itself obtained from $P_{ref1}$ and $P_{ref2}$) and from the averaged reference reactive power (itself obtained from $Q_{ref1}$ and $Q_{ref2}$).

Of course, the invention is not limited to the embodiments described, but includes any variant entering into the scope of the invention such as defined by the claims.

The invention can be implemented with a multiphase electricity meter connected to any number of phases (greater than or equal to two).

The architecture of FIGS. 1 to 5 could comprise a neutral wire coming from the network and entering into the meter, in addition to the three network voltage inputs UA, UB and UC (Thus, a "four-wire network" is referred to).

The invention can apply for a meter according (or not) to the MID.

It is noted that, during the implementation of the calibration method, it is possible to detect if the Rogowski sensors are correctly installed (from the direction of the current), and to generate an alarm when a Rogowski sensor is installed upside down.

The invention claimed is:
1. A method for the onsite calibration of a Rogowski sensor to be calibrated which is intended, in operation, to be connected to a multiphase electricity meter by being positioned on a phase to be calibrated, the method comprising the first steps of:
  positioning the Rogowski sensor to be calibrated on a first reference phase, on which a first already-calibrated reference Rogowski sensor is positioned, or positioning the first reference Rogowski sensor on the phase to be calibrated;
  acquiring a first calibration current measurement produced by the Rogowski sensor to be calibrated, a first reference current measurement produced by the first reference Rogowski sensor, and a first reference voltage measurement on a first positioning phase on which are positioned the Rogowski sensor to be calibrated and the first reference Rogowski sensor following the positioning step;
  using the first calibration current measurement, the first reference current measurement and the first reference voltage measurement to produce first calibration parameters ($K_1$, $\Delta\varphi_1$) of the Rogowski sensor to be calibrated.

2. The method according to claim 1, further comprising the steps of calculating a first active calibration power and a first reactive calibration power from the first calibration current measurement and from the first reference voltage measurement, as well as a first reference active power and a first reference reactive power from the first reference current measurement and from the first reference voltage measurement, and of calculating the first calibration parameters from the first active calibration power, from the first reactive calibration power, from the first reference active power and from the first reference reactive power.

3. The method according to claim 2, wherein the second steps comprise the step of calculating a second reference active power and a second reference reactive power, the method further comprising the steps of calculating an arithmetic average of the first reference active power and of the second reference active power to obtain an averaged reference active power, and of calculating an arithmetic average of the first reference reactive power and of the second reference reactive power to obtain an averaged reference reactive power, the consolidated calibration parameters being obtained from the first active calibration power, from the first reactive calibration power, from the averaged reference active power and from the averaged reference reactive power.

4. The method according to claim 2, wherein the first steps comprise the step of positioning the first reference Rogowski sensor on the phase to be calibrated, wherein the second steps comprise the step of positioning the second reference Rogowski sensor on the phase to be calibrated, and wherein the step of acquiring the first steps and the step of acquiring the second steps are carried out simultaneously.

5. The method according to claim 1, comprising second steps similar to the first steps, but implemented with, instead of the first reference phase and of the first reference Rogowski sensor, a second reference phase and a second already-calibrated reference Rogowski sensor, the first steps and the second steps making it possible to produce consolidated calibration parameters of the Rogowski sensor to be calibrated.

6. The method according to claim 5, the second steps making it possible to produce second calibration parameters ($K_2$, $\Delta\varphi_2$), the method further comprising the step of calculating an arithmetic average of the first calibration parameters and of the second calibration parameters to produce the consolidated calibration parameters.

7. The method according to claim 1, wherein the calibration parameters comprise a gain and a dephasing of a current measuring chain comprising the Rogowski sensor to be calibrated and an internal processing circuit integrated in the meter and comprising an integrator.

8. A multiphase electricity meter, comprising a processing unit arranged to implement a method for the onsite calibration of a Rogowski sensor to be calibrated which is intended, in operation, to be connected to the multiphase electricity meter by being positioned on a phase to be calibrated, the method comprising the first steps of:
positioning the Rogowski sensor to be calibrated on a first reference phase, on which a first already-calibrated reference Rogowski sensor is positioned, or positioning the first reference Rogowski sensor on the phase to be calibrated;
acquiring a first calibration current measurement produced by the Rogowski sensor to be calibrated, a first reference current measurement produced by the first reference Rogowski sensor, and a first reference voltage measurement on a first positioning phase on which are positioned the Rogowski sensor to be calibrated and the first reference Rogowski sensor following the positioning step;
using the first calibration current measurement, the first reference current measurement and the first reference voltage measurement to produce first calibration parameters (K1, $\Delta\varphi$1) of the Rogowski sensor to be calibrated.

9. The multiphase electricity meter according to claim 8, further comprising a man-machine interface, the processing unit being arranged to communicate with an operator via the man-machine interface to cause it to position the Rogowski sensor to be calibrated and/or the first reference Rogowski sensor and/or the second reference Rogowski sensor so as to implement the calibration method, and to, when the calibration method has been carried out, reposition the Rogowski sensor to be calibrated and/or the first reference Rogowski sensor and/or the second reference Rogowski sensor in their nominal position, so as to return the meter and the Rogowski sensors into a nominal configuration.

10. A non-transitory computer-readable recording medium, on which a computer program is recorded, wherein the computer program comprises instructions which drive a processing unit of a multiphase electricity meter to execute the steps of the following method:
positioning the Rogowski sensor to be calibrated on a first reference phase, on which a first already-calibrated reference Rogowski sensor is positioned, or positioning the first reference Rogowski sensor on the phase to be calibrated;
acquiring a first calibration current measurement produced by the Rogowski sensor to be calibrated, a first reference current measurement produced by the first reference Rogowski sensor, and a first reference voltage measurement on a first positioning phase on which are positioned the Rogowski sensor to be calibrated and the first reference Rogowski sensor following the positioning step;
using the first calibration current measurement, the first reference current measurement and the first reference voltage measurement to produce first calibration parameters (K1, $\Delta\varphi$1) of the Rogowski sensor to be calibrated.

* * * * *